United States Patent
Lee et al.

(10) Patent No.: US 12,439,621 B2
(45) Date of Patent: Oct. 7, 2025

(54) METHOD OF MAKING A CHARGE COUPLED FIELD EFFECT RECTIFIER DIODE

(71) Applicants: STMicroelectronics PTE LTD, Singapore (SG); STMicroelectronics (Tours) SAS, Tours (FR)

(72) Inventors: Shin Phay Lee, Singapore (SG); Voon Cheng Ngwan, Singapore (SG); Frederic Lanois, Tours (FR); Fadhillawati Tahir, Singapore (SG); Ditto Adnan, Singapore (SG)

(73) Assignees: STMicroelectronics PTE LTD, Singapore (SG); STMicroelectronics (Tours) SAS, Tours (FR)

(*) Notice: Subject to any disclaimer, the term of this patent is extended or adjusted under 35 U.S.C. 154(b) by 507 days.

(21) Appl. No.: 17/730,895

(22) Filed: Apr. 27, 2022

(65) Prior Publication Data
US 2022/0393022 A1    Dec. 8, 2022

Related U.S. Application Data

(60) Provisional application No. 63/197,599, filed on Jun. 7, 2021.

(51) Int. Cl.
*H10D 12/00* (2025.01)
*H10D 12/01* (2025.01)
*H10D 64/00* (2025.01)

(52) U.S. Cl.
CPC ......... *H10D 12/211* (2025.01); *H10D 12/021* (2025.01); *H10D 64/117* (2025.01)

(58) Field of Classification Search
CPC ............... H01L 29/7391; H01L 29/407; H01L 29/66356; H01L 29/861; H01L 29/401;
(Continued)

(56) References Cited

U.S. PATENT DOCUMENTS

| 5,637,898 A | 6/1997 | Baliga |
| 8,432,000 B2 | 4/2013 | Grebs |

(Continued)

FOREIGN PATENT DOCUMENTS

| CN | 101114674 A | 1/2008 |
| CN | 102694009 A | 9/2012 |

(Continued)

OTHER PUBLICATIONS

First Office Action and Search Report for counterpart EP Appl. No. 22305770.4, report dated Oct. 28, 2022, 10 pgs.
(Continued)

*Primary Examiner* — Caleb E Henry
(74) *Attorney, Agent, or Firm* — Crowe & Dunlevy LLC

(57) ABSTRACT

A trench in a semiconductor substrate is lined with a first insulation layer. A hard mask layer deposited on the first insulation layer is used to control performance of an etch that selectively removes a first portion of the first insulating layer from an upper trench portion while leaving a second portion of first insulating layer in a lower trench portion. After removing the hard mask layer, an upper portion of the trench is lined with a second insulation layer. An opening in the trench that includes a lower open portion delimited by the second portion of first insulating layer in the lower trench portion and an upper open portion delimited by the second insulation layer at the upper trench portion, is then filled by a single deposition of polysilicon material forming a unitary gate/field plate conductor of a field effect rectifier diode.

26 Claims, 13 Drawing Sheets

(58) Field of Classification Search
CPC .......... H01L 29/6609; H01L 29/66136; H01L 21/8249; H01L 27/0629; H01L 29/66734; H01L 29/7813; H10D 12/211; H10D 12/021; H10D 64/117; H10D 8/00; H10D 8/01; H10D 64/01; H10D 30/0297; H10D 30/668; H10D 84/0109; H10D 84/038; H10D 84/811; H10D 8/045
See application file for complete search history.

(56) References Cited

U.S. PATENT DOCUMENTS

| | | | |
|---|---|---|---|
| 8,450,794 B2 | 5/2013 | Bhalla et al. | |
| 8,558,315 B2 | 10/2013 | Chen et al. | |
| 8,564,024 B2 | 10/2013 | Yedinak et al. | |
| 8,581,336 B2 | 11/2013 | Long et al. | |
| 8,597,998 B2 | 12/2013 | Bhalla et al. | |
| 8,673,700 B2 | 3/2014 | Yedinak et al. | |
| 8,686,493 B2 | 4/2014 | Thorup et al. | |
| 8,936,985 B2 | 1/2015 | Challa et al. | |
| 9,099,554 B2* | 8/2015 | Kang | H01L 21/76224 |
| 9,190,478 B2* | 11/2015 | Calafut | H10D 8/605 |
| 9,368,587 B2 | 6/2016 | Kocon et al. | |
| 9,761,695 B1* | 9/2017 | Fan | H10D 30/668 |
| 9,793,391 B2* | 10/2017 | Haeberlen | H01L 29/7805 |
| 10,291,108 B2 | 5/2019 | Ahlers et al. | |
| 10,854,759 B2 | 12/2020 | Blair et al. | |
| 2004/0150038 A1* | 8/2004 | Hshieh | H01L 21/28185 257/330 |
| 2005/0127464 A1 | 6/2005 | Wu | |
| 2010/0059816 A1 | 3/2010 | Shimada et al. | |
| 2010/0264488 A1* | 10/2010 | Hsieh | H01L 29/66727 257/334 |
| 2011/0089527 A1* | 4/2011 | Blank | H10D 12/038 257/E29.017 |
| 2012/0241854 A1 | 9/2012 | Ohta et al. | |
| 2014/0087539 A1* | 3/2014 | Lizio | H01L 21/266 438/306 |
| 2014/0159197 A1* | 6/2014 | Weng | H10D 1/043 257/532 |
| 2016/0027900 A1* | 1/2016 | Ng | H10D 30/0295 438/270 |
| 2017/0033213 A1* | 2/2017 | Hsu | H10D 30/0297 |
| 2020/0105946 A1* | 4/2020 | Lanois | H01L 29/8613 |
| 2020/0328084 A1 | 10/2020 | Lai et al. | |

FOREIGN PATENT DOCUMENTS

| | | |
|---|---|---|
| CN | 104282550 A | 1/2015 |
| CN | 110970490 A | 4/2020 |
| CN | 218602431 U | 3/2023 |
| WO | 2005031877 A1 | 4/2005 |

OTHER PUBLICATIONS

Wu, et al: "Split-gate LDMOS with double vertical field plates," Micro & Nano Letters 13, No. 11: 1580-1584, Nov. 1, 2018.
CN First Office Action and Search Report for counterpart CN Appl. No. 202210633599.7, report dated Apr. 23, 2025, 9 pgs.

\* cited by examiner

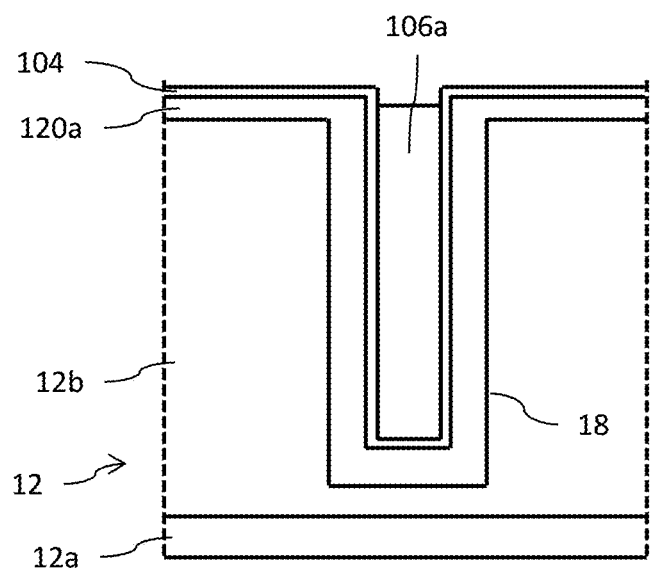
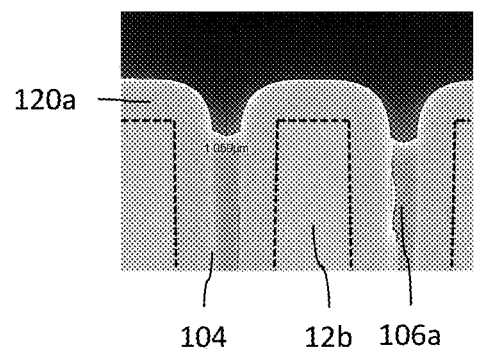
FIG. 7A  FIG. 7B
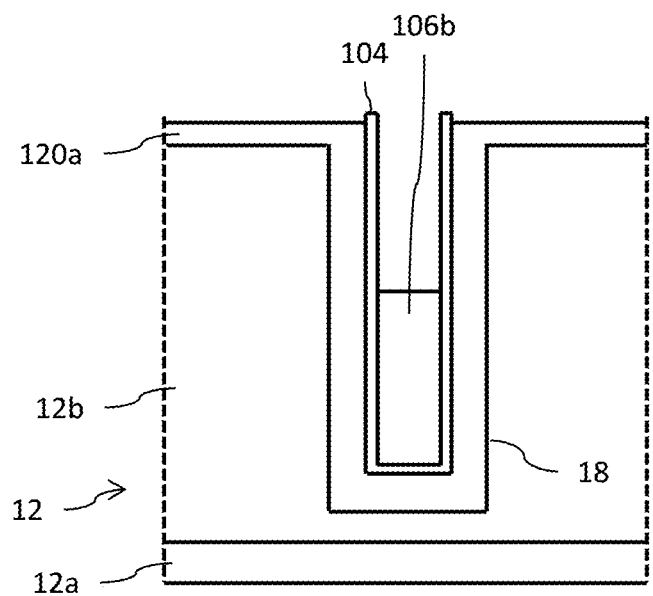
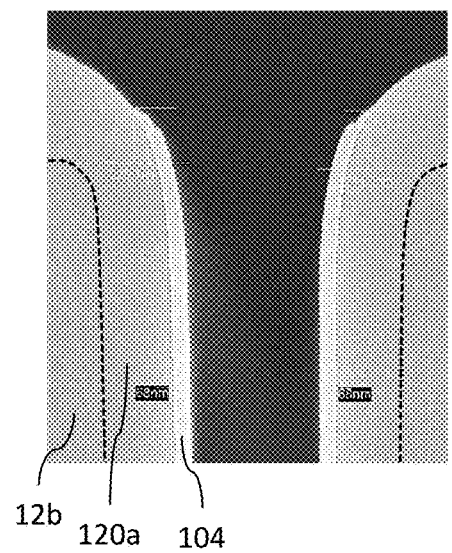
FIG. 8A  FIG. 8B

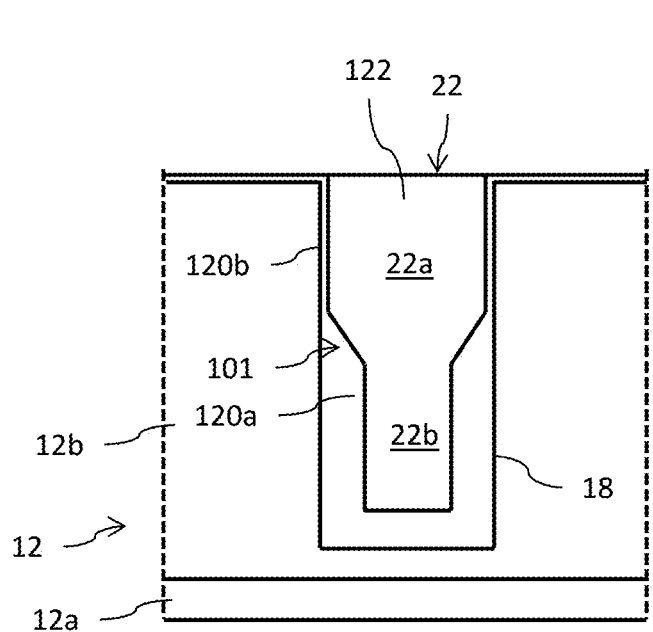
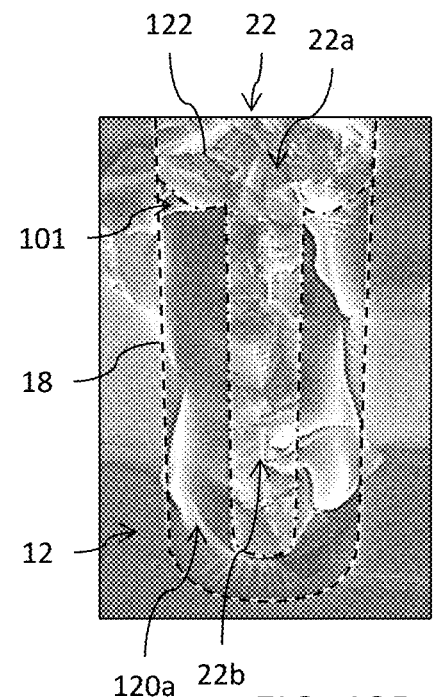
FIG. 13A    FIG. 13B
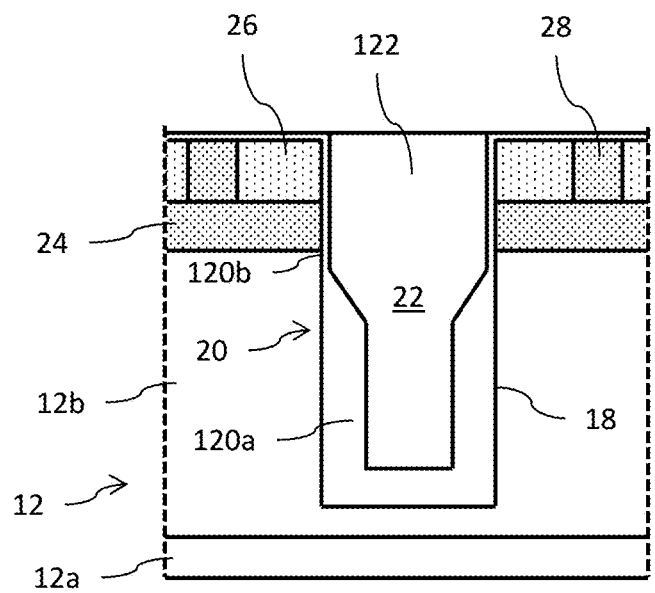
FIG. 14

METHOD OF MAKING A CHARGE COUPLED FIELD EFFECT RECTIFIER DIODE

CROSS REFERENCE TO RELATED APPLICATIONS

This application claims priority from United States Provisional Application for Patent No. 63/197,599 filed Jun. 7, 2021, the disclosure of which is incorporated herein by reference.

TECHNICAL FIELD

The present invention generally relates to charge coupled integrated circuit devices and, in particular, to a charge coupled field effect rectifier diode and its method of making.

BACKGROUND

Reference is made to FIG. 1 which shows a cross-section of an embodiment of a charge coupled field effect rectifier diode (FERD) device 10 as taught by United States Patent Application Publication No. 2020/0105946, now U.S. Pat. No. 11,239,376 (incorporated herein by reference). The device 10 is formed in and on a semiconductor substrate 12 (for example, silicon). The substrate 12 has a front side 14 and a back side 16. The substrate 12 provides a cathode region of the field effect diode 10 that includes a first doped region 12a that is more heavily doped with an n-type dopant and an overlying second doped region 12b that is less heavily doped with the n-type dopant. A cathode metal layer 38 extends over the back side 16 of the substrate 12 to provide a metal connection to the cathode region.

A plurality of trenches 18 extend depthwise into the substrate 12 from the front side 14. The trenches 18 are regularly spaced apart and extend lengthwise parallel to each other in a direction perpendicular to the cross-section (i.e., into and out the page of the illustration), with adjacent trenches delimiting side edges of a mesa region 13 of the diode. As a variation, trenches 18 may be formed in the shape of rings surrounding the mesa region 13.

A region 24 doped with a p-type dopant is buried in the mesa regions 13 of the substrate 12 at a depth offset from (i.e., below) the front side 14 and positioned extending parallel to the front side 14 on opposite sides of each trench 18. The doped region 24 forms the body (channel) region of the field effect diode, with the trench 18 passing completely through the doped body region 24 and into the substrate 12 below the doped body region 24. A surface region 26 heavily doped with an n-type dopant is provided in the mesa regions 13 at the front side 14 of the substrate 12 and positioned extending parallel to the front side 14 on opposite sides of each trench 18 and in contact with the top of the doped body region 24. The doped region 26 forms the source region of the field effect diode, with the trench 18 passing completely through the doped source region 26 and further extending, as noted above, completely through the doped body region 24 into the substrate 12 below the doped body region 24. A contact region 28 heavily doped with a p-type dopant is provided at the front side 14 of the substrate 12 between adjacent trenches 18 and passes through the doped region 26 to make contact with the doped region 24.

The side walls and bottom of each trench 18 are lined with an insulating layer 20 made, for example, of silicon oxide. In a lower portion of the trench 18, the insulating layer 20 has a first thickness, and in an upper portion of the trench 18, the insulating layer 20 has a second thickness (where the second thickness is less than the first thickness). Each trench 18 is filled by a doped polysilicon material to form a conductive structure 22. Because of the difference in insulating layer 20 thicknesses within the trench 18, the conductive structure 22 has a first lateral width in the lower portion of the trench 18, and has a second lateral width in the upper portion of the trench 18 (where the second lateral width is greater than the first lateral width). The conductive structure 22 is a unitary body of conductive material comprising a combination of a gate electrode 22a (in the upper portion of the trench) and field plate electrode 22b (in the lower portion of the trench) for the diode. In view of the difference in thicknesses of the insulating layer 20, when a potential is applied to the conductive structure 22, the gate electrode 22a and field plate electrode 22b will exert different electrostatic influences on semiconductor regions along the depth of the trenches 18. In particular, the gate electrode 22a will have a stronger electrostatic influence than the field plate electrode 22b.

The conductive structure 22 (including its constituent gate electrode 22a and field plate electrode 22b), the doped region 26 forming the source region and the doped region 28 forming the body contact are all electrically connected to an anode terminal of the field effect diode. An anode metal layer 32 extends over the substrate 12 and trenches 18. The layer 32 may, for example, be made of aluminum, aluminum-copper, or aluminum-silicon-copper. A conductive interface layer 34 is positioned between the anode metal layer 32 and the substrate 12 with trenches 18. The layer 34 may, for example, comprise a silicide layer. Alternatively, the layer 34 may comprise a metal barrier material such a titanium. The layer 34 may not be a continuous layer (as shown), but rather may be discontinuous and locally present only at the locations where semiconductor material is present.

Manufacture of the structure shown in FIG. 1 has proven to be a challenge and typically requires multiple precise etching operations and two separate polysilicon deposition steps to form, respectively, the field plate electrode 22b and the gate electrode 22a of the conductive structure 22.

Alternatively, as shown by FIGS. 2A-2F of United States Patent Application Publication No. 2020/0105946, now U.S. Pat. No. 11,239,376, a process for manufacturing is used where the conductive structure 22 is actually produced as two separate parts comprising a split gate electrode part 22a' and a field plate electrode part 22b' insulated from each other in the trench 18 by an oxide layer 19 and electrically connected to each other by the anode metal layer 32. This structure is shown in FIG. 2.

There is a need in the art for a more effective and efficient method of manufacturing the charge coupled FERD device 10 with the structural configuration as shown in FIG. 1.

SUMMARY

In an embodiment, a method comprises: forming a trench in a semiconductor substrate which provides a cathode region of a field effect rectifier diode (FERD); lining the trench with a first insulation layer; depositing a hard mask layer on the first insulation layer; performing an etch controlled by the hard mask layer to selectively remove a first portion of the first insulating layer from an upper portion of the trench while leaving a second portion of first insulating layer in a lower portion of the trench; removing the hard mask layer from the trench; lining an upper portion of the trench with a second insulation layer that extends from the second portion of first insulating layer; making a single deposition of polysilicon material in the trench to fill an opening in the trench, said opening including a lower open portion delimited by the second portion of first insulating layer in the lower portion of the trench and an upper open portion delimited by the second insulation layer at the upper portion of the trench; wherein said polysilicon material filling the opening forms a unitary conductive structure in the trench comprising: a field plate of the FERD insulated from the semiconductor substrate by the second portion of first insulating layer and a gate of the FERD insulated from the semiconductor substrate by the second insulating layer; implanting and activating a first type dopant in the semiconductor substrate to form a body region of the FERD; and implanting and activating a second type dopant in the semiconductor substrate to form a source region of the FERD.

In an embodiment, a method comprises: forming a trench in a semiconductor substrate; lining the trench with a first insulation layer; depositing a hard mask layer on a surface of the first insulation layer in the trench; performing an etch controlled by the hard mask layer to selectively remove a first portion of the first insulating layer from an upper portion of the trench while leaving a second portion of first insulating layer in a lower portion of the trench; removing the hard mask layer from the trench; lining an upper portion of the trench with a second insulation layer extending from the second portion of first insulating layer; and making a single deposition of polysilicon material in the trench to fill an opening in the trench, said opening having a lower open portion delimited by the second portion of first insulating layer in the lower portion of the trench and an upper open portion delimited by the second insulation layer at the upper portion of the trench.

In an embodiment, an integrated circuit comprises: a semiconductor substrate having a front side and a back side; a trench extending into the semiconductor substrate from the front side, said trench including a lower part and an upper part; a first insulation layer lining sidewalls of the lower part of the trench; a second insulating layer lining sidewalls of the upper part of said trench; wherein said first insulating layer is thicker than said second insulating layer; wherein the first insulation layer includes a tapered thickness region transitioning between the first thickness and the second thickness; and a unitary body of polysilicon material filling an opening in the trench that has a lower open portion delimited by the first insulating layer in the lower part of the trench and an upper open portion delimited by the second insulation layer at the upper part of the trench.

BRIEF DESCRIPTION OF THE DRAWINGS

For a better understanding of the embodiments, reference will now be made by way of example only to the accompanying figures in which:

FIGS. 3-15 show steps of a method for making a charge coupled FERD;

FIGS. 18, 19 and 20A to 22A show steps of a method for making the charge coupled FERD of FIG. 17.

FIGS. 20B-22B show steps of a method for making a charge coupled FERD; and

DETAILED DESCRIPTION

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings or to a normal position of use.

Figure 15:
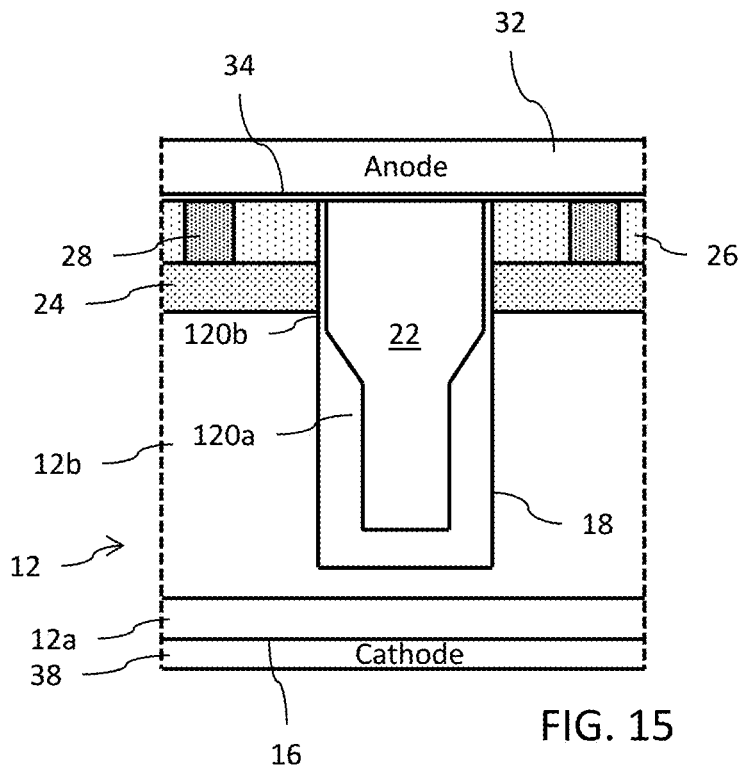
Figure 16:
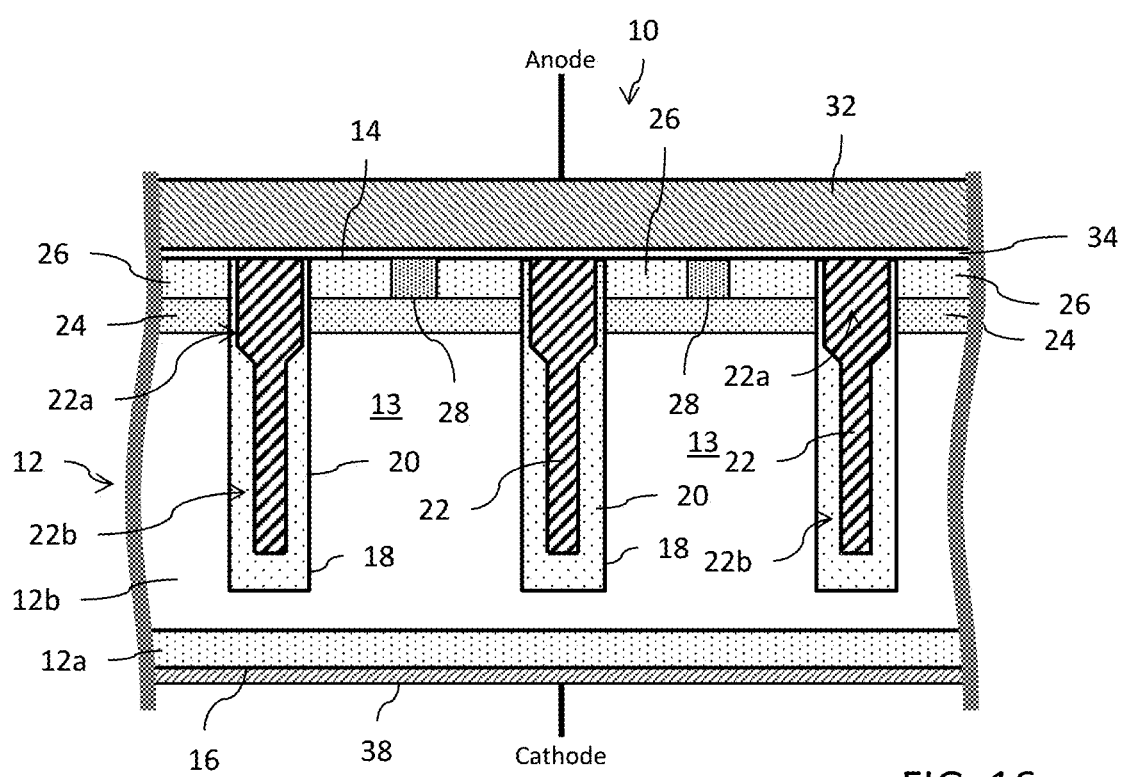
FIG. 16 shows a cross-section of the charge coupled FERD device produced by the method of FIGS. 3-15.

Reference is now made to FIGS. 3-15 which show steps of a method for making a charge coupled FERD device 10 as shown in FIG. 16.

Figure 1:
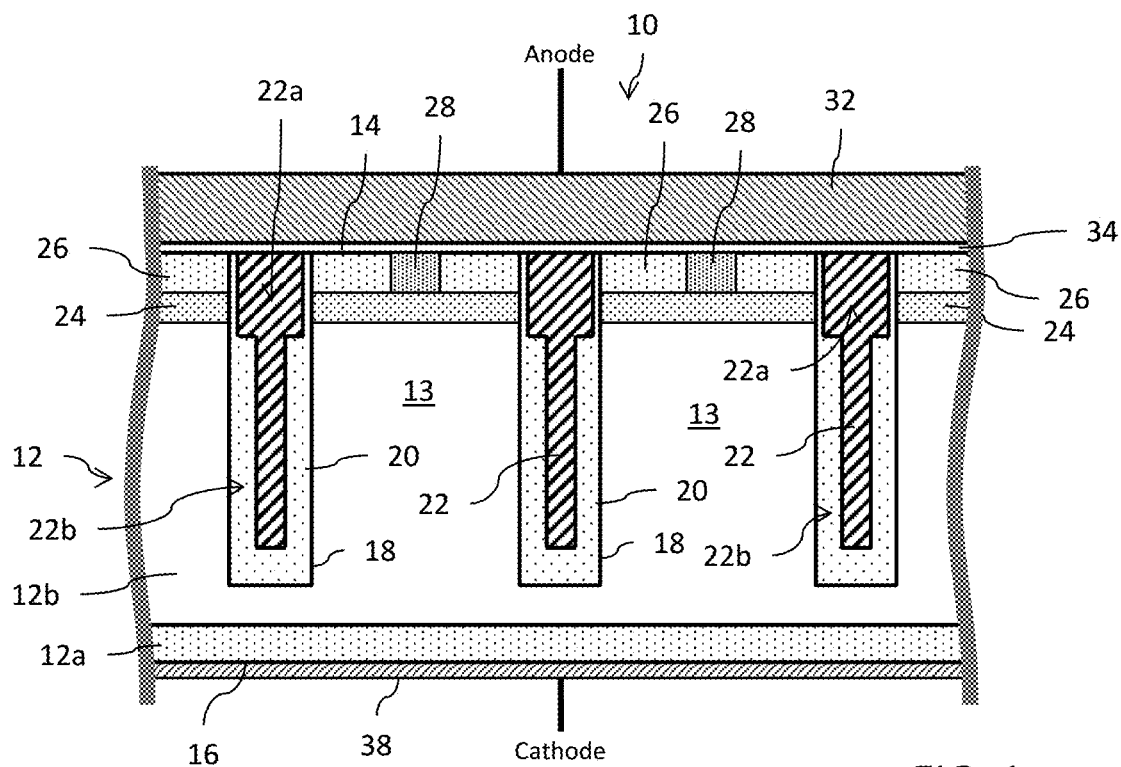
FIGS. 1 and 2 are cross-sections of a charge coupled field effect rectifier diode (FERD) device as taught by United States Patent Application Publication No. 2020/0105946, now U.S. Pat. No. 11,239,376.
Figure 2:
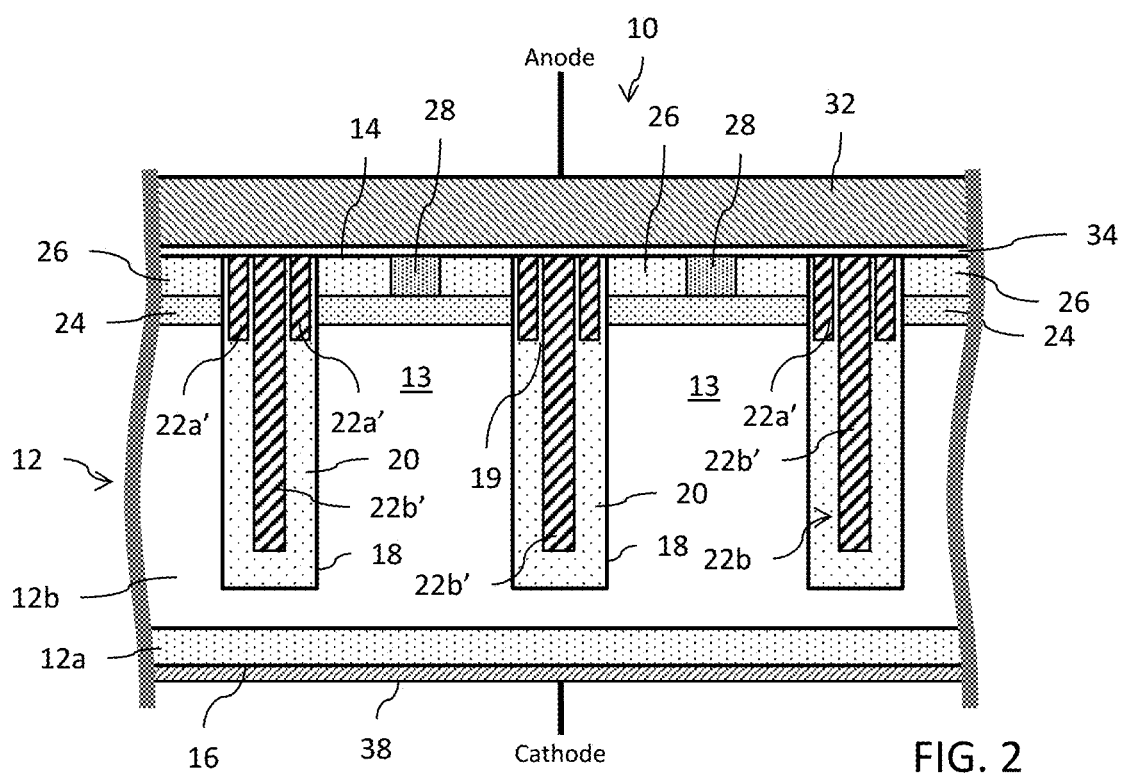
Figure 3:
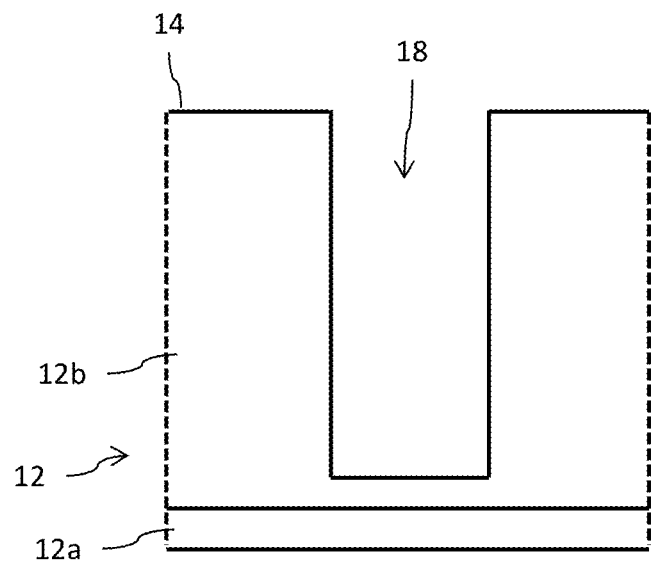

FIG. 3 shows the formation of a trench 18 extending into a semiconductor substrate 12 from a front side 14 thereof. The illustrated trench 18 is one of a plurality of trenches that are formed in connection with the fabrication of the diode 10. The semiconductor substrate 12 includes a first doped region 12a that is more heavily doped with an n-type dopant and an overlying second doped region 12b that is less heavily doped with the n-type dopant. The trench 18 has a depth in the second doped region 12b that does not reach the first doped region 12a. The trench 18 may be formed using conventional lithographic processing techniques. For example, a mask is formed over the substrate 12 with a mask opening at the location where each trench 18 is to be formed. An etching process is then used to open the trench 18 in the substrate 12.

Figure 4:
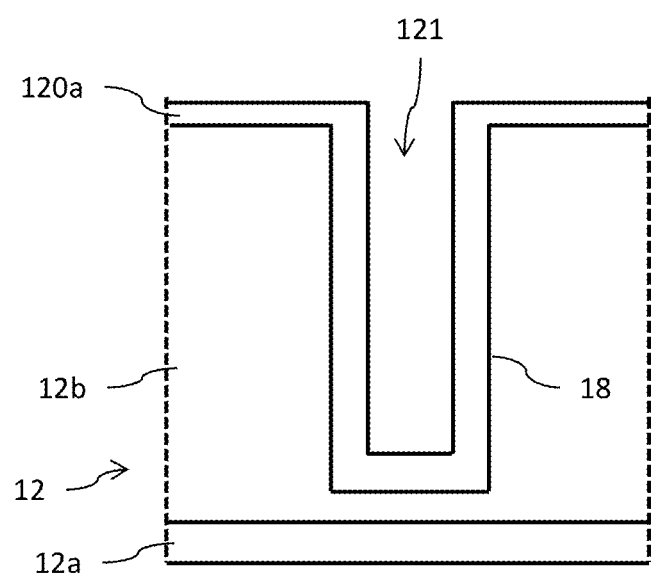

After the trench 18 is formed, an insulating dielectric layer 120a is conformally formed, for example by thermal oxidation, on the exposed surfaces of the substrate 12. This would include the front side 14 of the substrate as well as the side walls and bottom of the trench 18. The thickness of the layer 120a is controlled to be smaller than one-half of the lateral width of each trench 18 so as to leave an opening 121 in the center of the trench 18. The result is shown in FIG. 4.

Figure 5:
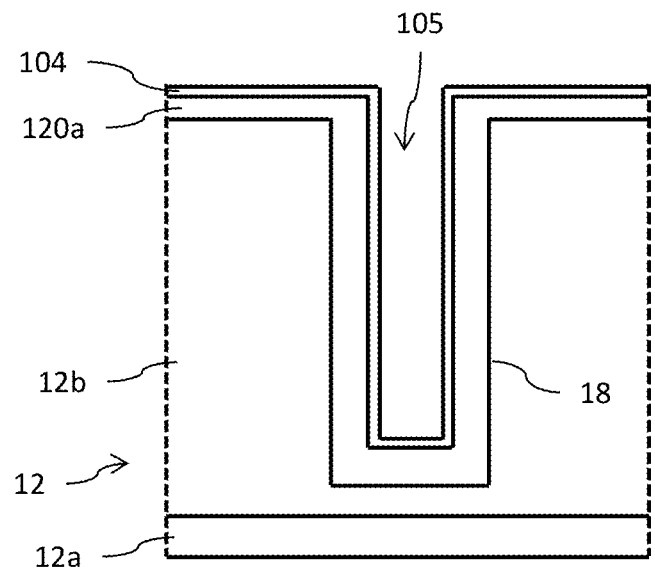

A conformal (blanket) deposition of a nitride layer 104 is then made over the substrate 12 as shown in FIG. 5. The nitride layer 104 covers the layer 120a above the front side 14 of the substrate as well as along the side walls and bottom of the opening 121 that was left in the trench 18. The thickness of the layer 104 is controlled to be smaller than one-half of the lateral width of each opening 121 so as to leave an opening 105 in the center of the trench 18. This nitride layer 104 is eventually used, as discussed below, as a hard mask.

Figure 6:
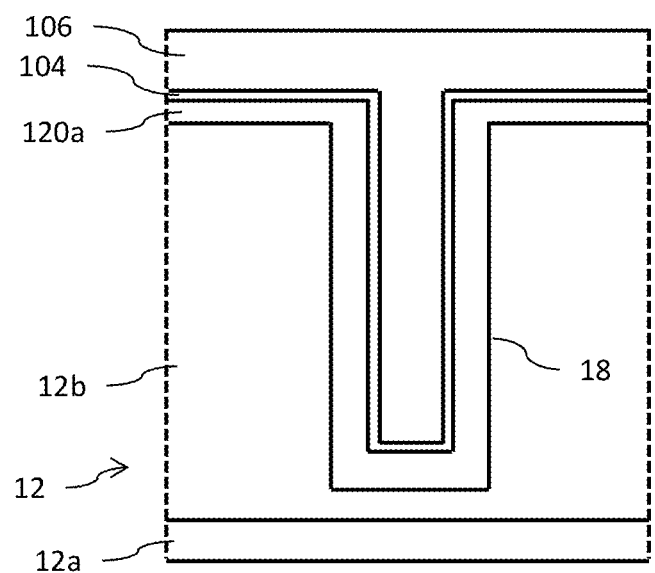

A layer of resist 106 is then deposited as shown in FIG. 6 to cover the layer 104 and fill the opening 105.

The resist 106 is then lithographically patterned to be removed from areas over and around the location of the trench 18. Portions 106a of the resist then remain in the opening 105 in the center of the trench 18. The result is shown in FIGS. 7A and 7B (where FIG. 7B is a scanning electron micrograph (SEM) image of the cross-section shown in FIG. 7A focusing at the top of the trench 18). It will be noted that horizontal portions of the layer 104 are exposed as a result of the lithographically patterning of the resist 106 layer.

A dry etch is then performed to remove the horizontal portions of the nitride layer 104 and thus delimit the structure of the nitride hard mask relative to the layer 120a. This etch also removes a portion of the resist 106a at the upper part of the trench 18 (leaving portion 106b at the bottom of the trench). The result is shown in FIGS. 8A and 8B (where FIG. 8B is a scanning electron micrograph (SEM) image of the cross-section shown in FIG. 8A focusing on the top part of the trench where the horizontal portions of the nitride layer 104 and the portion of the resist 106a at the upper part of the trench 18 have been removed). The effect of this dry etch to remove the horizontal portion of the nitride layer 104 is to expose an upper end of the layer 120a in the trench 18.

Figure 9A:
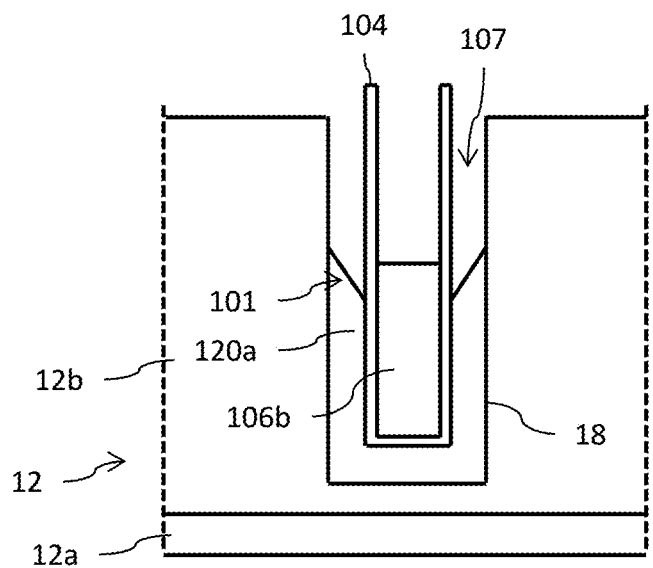
Figure 9B:
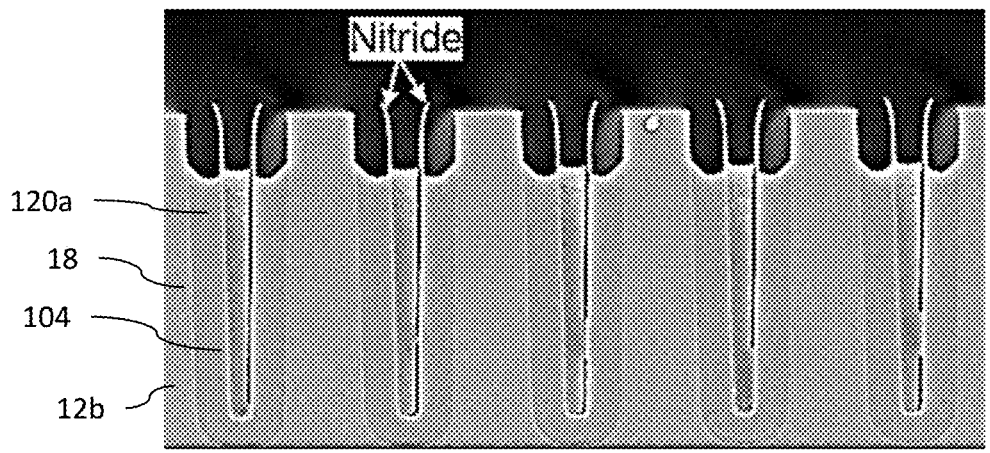

A field plate oxide wet etch is then performed to remove portions of the layer 120a which are not protected by the nitride layer hard mask or the resist 106b on top of the nitride hard mask. This is effectively a selective etch which performs a recessing of the layer 120a from the exposed upper end. The result is shown in FIGS. 9A and 9B (where FIG. 9B is a scanning electron micrograph (SEM) image of the cross-section shown in FIG. 9A). This etch forms an opening 107 between the layer 104 and the sidewalls of the trench 18 and shapes the portion of insulating layer 20 made from layer 120a at the bottom of the trench to include a tapered thickness region 101 where the thickness of the layer 120a increases from the side wall of the trench 18 with increased depth into the trench. The provision and shaping of the tapered thickness region 101 arise as a result of the etch which is controlled by the presence of the hard mask layer 104 and produces a recessing of the layer 120a.

The advantages of using the nitride layer 104 as a hard mask during the recessing of the layer 120a with the field plate oxide wet etch are clearly evident in FIG. 9B. The quality of recessing of the layer 120a over the plurality of trenches 18 for the purpose of uniformly removing the portion of layer 120a in the upper portion of the trench and uniformly defining the shape of the layer 120a in the lower portion of the trench is assured. There is little to no variation from trench to trench as to the shape of the layer 120a in the lower portion of the trench.

It will be noted that the use of nitride for the material of the hard mask provided by layer 104 is just an example. Any suitable material can be used for layer 104 provided it provides the requisite hard mask functionality in connection with the etching process for recessing the layer 120a in the trenches 18.

Figure 10:
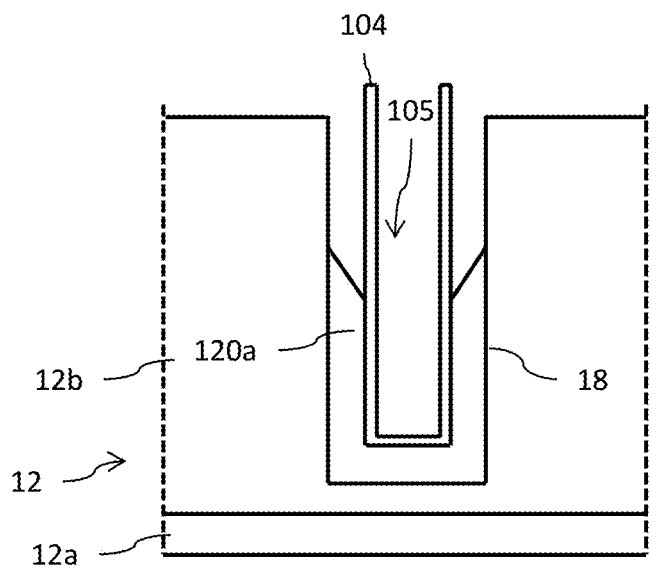

The remaining portion of the resist 106b in the trench 18 is then stripped, leaving the opening 105 in the trench 18. The result is shown in FIG. 10. It is worth noting here that the recessing of the layer 120a is associated with the nitride hard mask alone and, as an alternative step in the process, that the remaining portion of the resist 106b may have been etched away just after the nitride hard mask dry etch.

Figure 11:
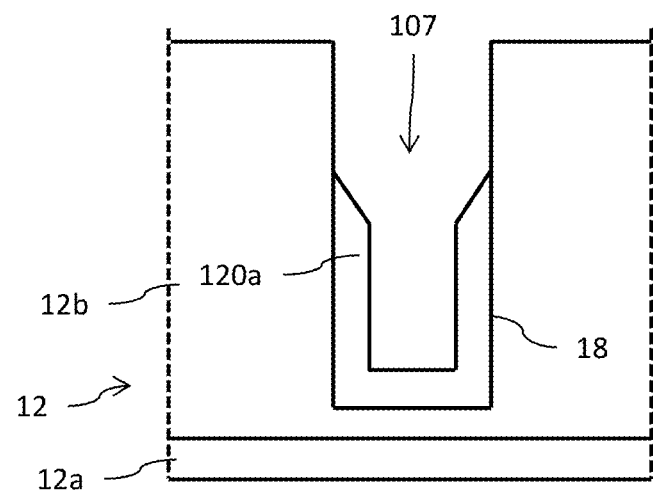

A nitride wet etch is then performed to remove the nitride hard mask portion of the layer 104. The result is shown in FIG. 11. This leaves only the portion of the layer 120a at the bottom of the trench and defines an opening 107 in the center of the trench 18 having an upper part delimited by the side walls of the trench 18 and a lower part delimited by the remaining portion of the layer 120a.

Figure 12:
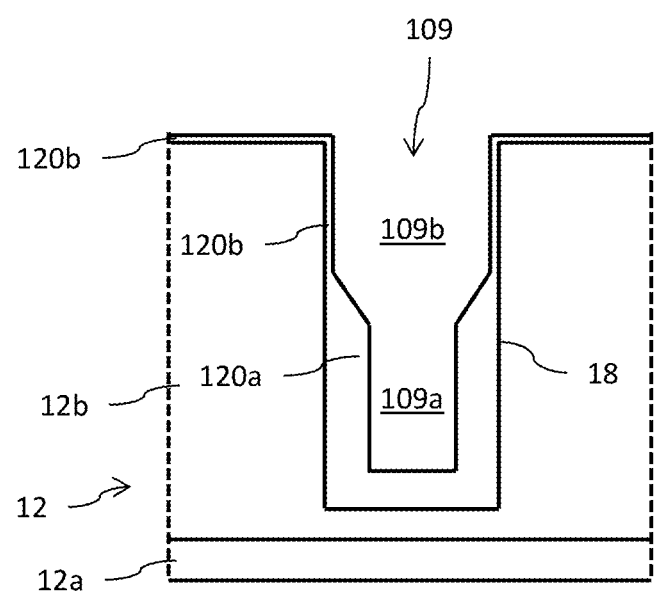

An insulating dielectric layer 120b is then conformally formed, for example by thermal oxidation, on the exposed surfaces of the substrate 12. This would include the front side 14 of the substrate as well as the side walls at the upper portion of the trench 18 in opening 107 which are not covered by the layer 120a. The result is shown in FIG. 12 with the insulating dielectric layer 120b extending along the trench side walls from the portion of layer 120a which remains in the trench. The insulating layers 120a and 120b form the insulating layer 20 of the diode 10 and delimit an opening 109 in the trench 18 which includes a lower portion 109a having a first width extending between the lower portion of the insulating layer 20 (formed by the remaining portion of the layer 120a in the trench) and an upper portion 109b having a second width extending between the upper portion of the insulating layer 20 (formed by the portion of layer 120b in the trench). The second width is greater than the first width. The thickness of the layer 120b is controlled to provide a desired gate oxide thickness for the diode 10.

A single deposition of n-type highly doped polysilicon material 122 is then made to fill the opening 109 and form the conductive structure 22 of the diode 10. Excess polysilicon material above the front side 14 of the substrate 12 is removed using a polysilicon dry etch so that the upper surface of the conductive structure 22 is coplanar (or substantially coplanar) with the upper surface of the layer 120b (or the upper surface of the substrate 12). The result is shown in FIGS. 13A and 13B (where FIG. 13B is a scanning electron micrograph (SEM) image of the cross-section shown in FIG. 13A). The deposited polysilicon material 122 forms the unitary body of the conductive structure 22 which includes the gate electrode portion 22a (in the upper portion of the trench) and field plate electrode portion 22b (in the lower portion of the trench) for the diode.

Conventional processes well known in the art for implanting and activating dopants for forming the p-type doped body region 24, n-type doped source region 26 and p-type doped body contact region 28 are then performed. Because of its high doping level, there is no risk here of the formation of a p-n junction in the polysilicon material 122. The result is shown in FIG. 14.

A conductive interface layer 34 is then formed over the substrate. In an embodiment, the horizontal portions of the layer 120b at the front side 14 of the substrate 12 may be removed. The layer 34 may comprise a silicide layer in contact with the polysilicon material 122 of the conductive structure 22 and the semiconductor materials for the n-type doped source region 26 and p-type doped contact region 28. Alternatively, the layer 34 may comprise a metal barrier. An anode metal layer 32 is then blanket deposited over the interface layer 34, and lithographically patterned as needed, to provide electrical connection to the anode terminal of the field effect diode. The back side 16 of the substrate 12 is further processed with a backlap and/or grind to provide a surface to which a cathode metal layer 38 is deposited. The result is shown in FIG. 15 and the process for forming the charge coupled FERD device 10 as shown in FIG. 16 is complete.

Figure 17:
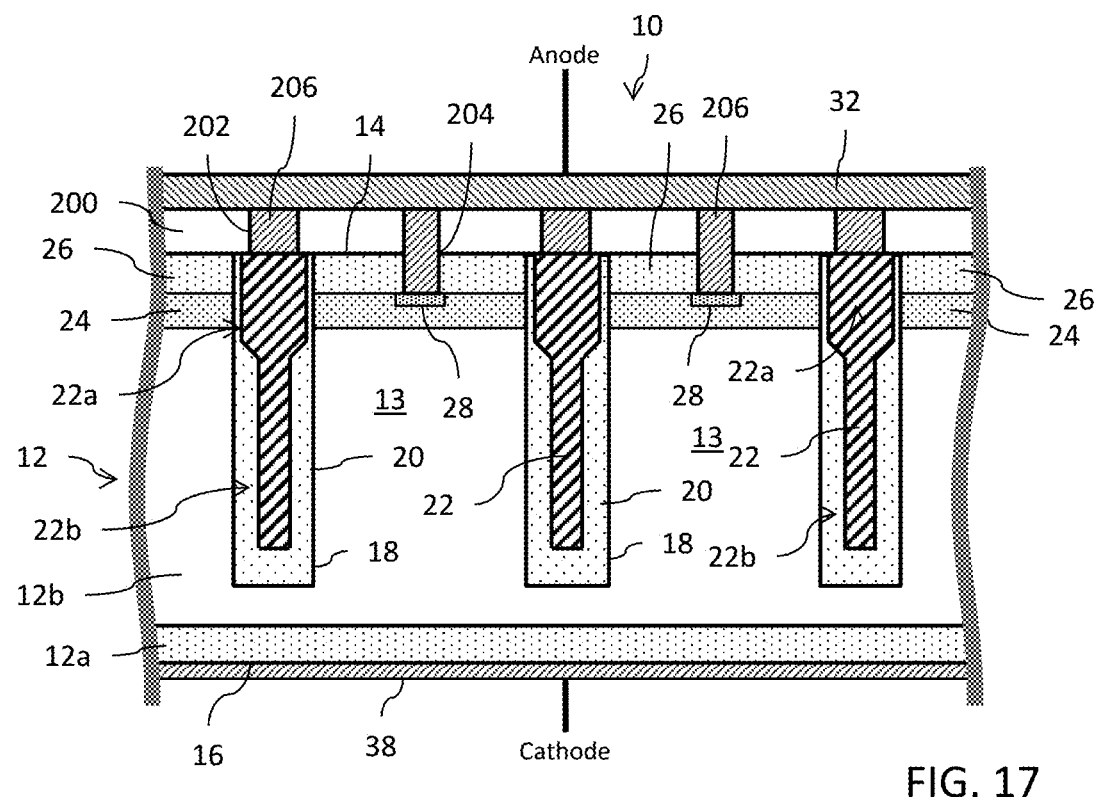
FIG. 17 shows a cross-section of an alternative embodiment for a charge coupled FERD device.

Reference is now made to FIG. 17 which shows a cross-section of another embodiment of a charge coupled field effect rectifier diode (FERD) device 10. Like references refer to like or similar components. The device 10 of FIG. 17 differs from the device 10 of FIG. 16 in terms of the structures fabricated above the front side 14 of the substrate 12. A premetallization dielectric (PMD) layer 200 extends over the front side 14 of the substrate 12. An opening 202 is formed to extend through PMD layer 200 to reach the conductive structure 22. Furthermore, an opening 204 is formed to extend through the PMD layer 200 and the doped source region 26 to reach at least the top of the doped body region 24. The p-type doped body contact region 28 is formed at the bottom of the opening 204. A silicide layer, not explicitly shown, may be formed at the bottom of each opening 202 and 204 to improve contact resistance. The openings 202 and 204 are filled with a metal material to form electrical contacts 206. The anode metal layer 32 is then blanket deposited over the PMD layer 200, and lithographically patterned as needed, to provide electrical connection to the anode terminal of the field effect diode.

The process for making the diode device 10 of FIG. 17 utilizes the same steps of the process shown in FIGS. 3-13. The steps for completing fabrication of the device after the step of FIG. 13 are shown in FIGS. 18, 19 and 20A-22A.

Figure 18:
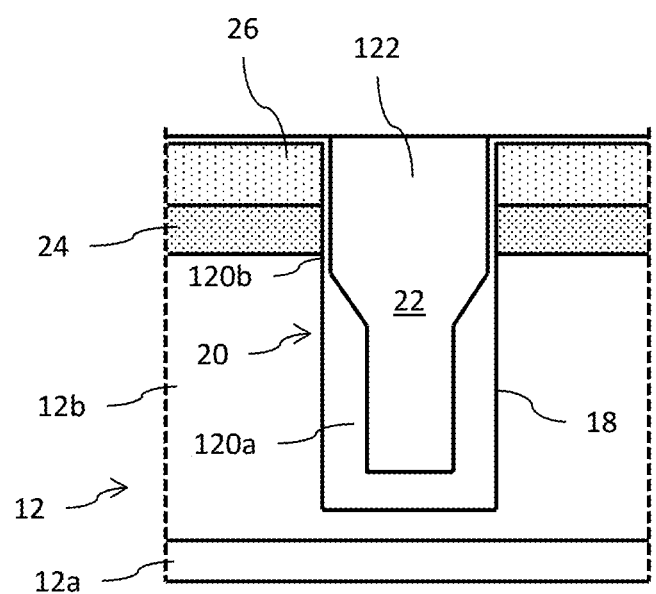

Following the processing step of FIG. 13, conventional processes well known in the art for implanting and activating dopants for forming the p-type doped body region 24 and n-type doped source region 26 are then performed. Because of its high doping level, there is no formation of p-n junctions in the polysilicon material 122. The result is shown in FIG. 18.

Figure 19:
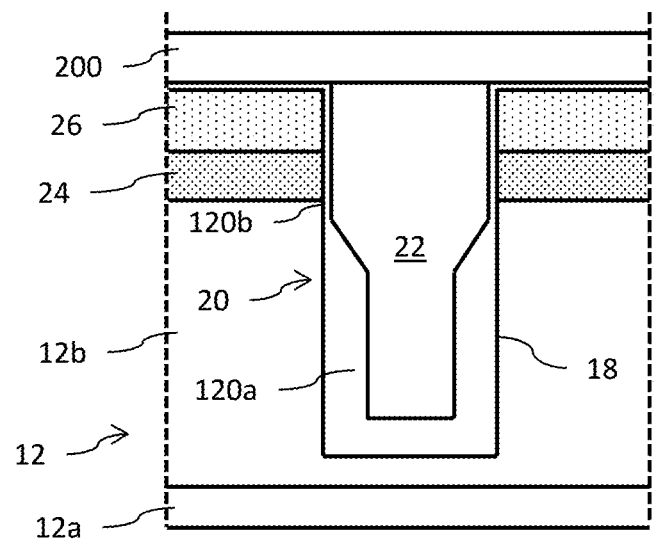

A layer of dielectric material is then formed over the substrate to provide the PMD layer 200. In an embodiment, the horizontal portions of the layer 120b at the front side 14 of the substrate 12 may be removed. The result is shown in FIG. 19.

Figure 20A:
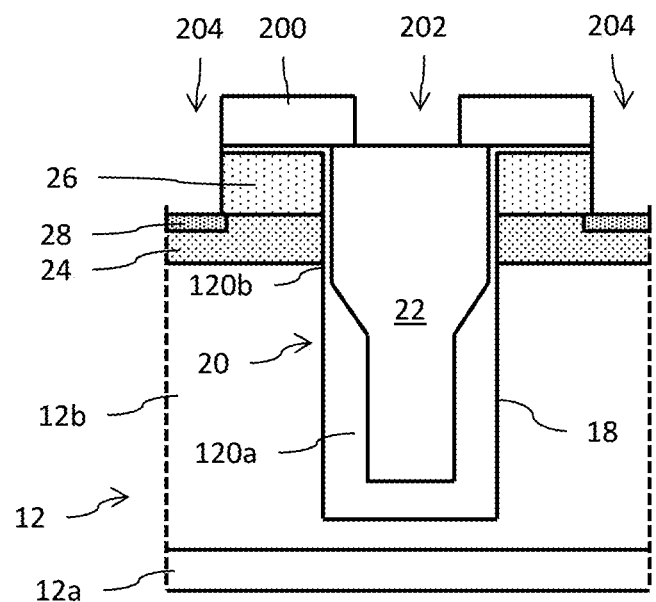

FIG. 20A shows the formation of openings 202 and 204 extending from an upper surface of the PMD layer 200. The openings 202 extend completely through the PMD layer 200 to reach the conductive structure 22. The openings 204 extend completely through both the PMD layer 200 and the doped source region 26 to reach at least the top of the doped body region 24. The openings 202 and 204 may each be formed using conventional lithographic processing techniques. For example, a mask is formed over the PMD layer 200 with a mask opening at the location where the opening (202 or 204) is to be formed. An etching process then forms the opening with a desired depth. In connection with the formation of the openings 204, a dopant implantation process is performed to implant the body contact regions 28 in the body region 24 at the bottom of each opening 204.

Figure 21B:
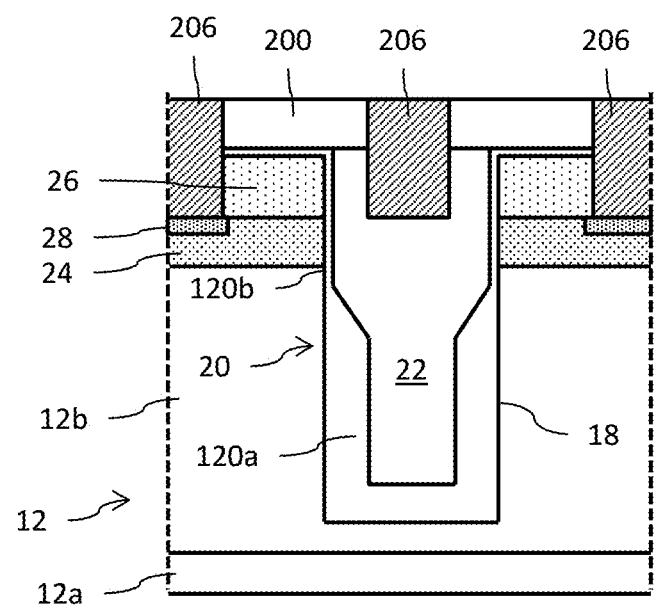
Figure 21A:
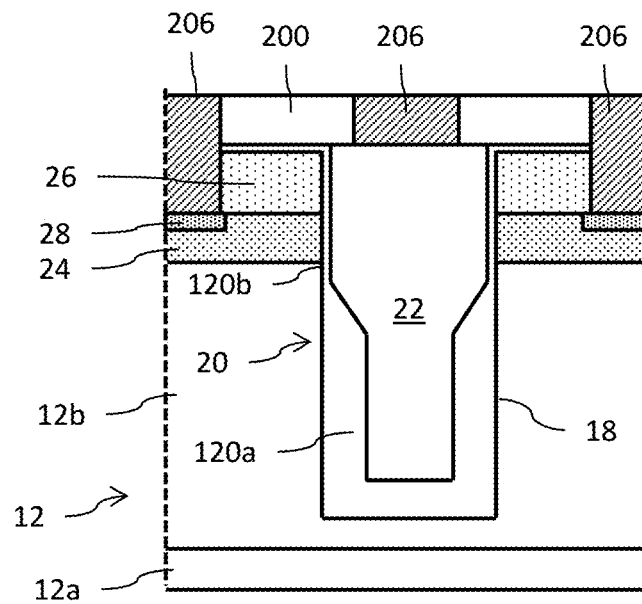

The openings 202 and 204 are then filled with a metal material (for example, tungsten) to form electrical contacts 206. The result is shown in FIG. 21A.

Figure 22A:
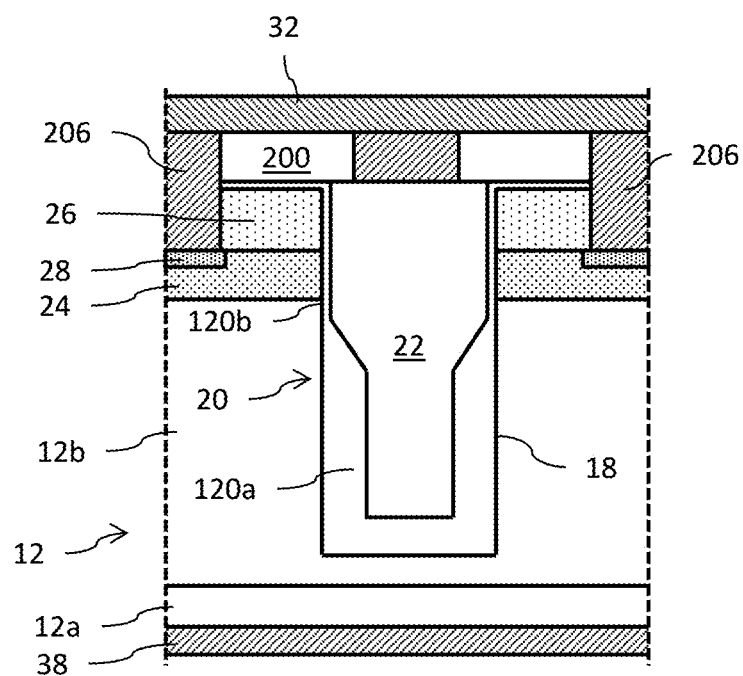

An anode metal layer 32 is then blanket deposited over the PMD layer 200, and lithographically patterned as needed, to provide electrical connection to the anode terminal of the field effect diode. The back side 16 of the substrate 12 is further processed with a backlap and/or grind to provide a surface to which a cathode metal layer 38 is deposited. The result is shown in FIG. 22A and the process for forming the diode 10 as shown in FIG. 17 is complete.

Figure 20B:
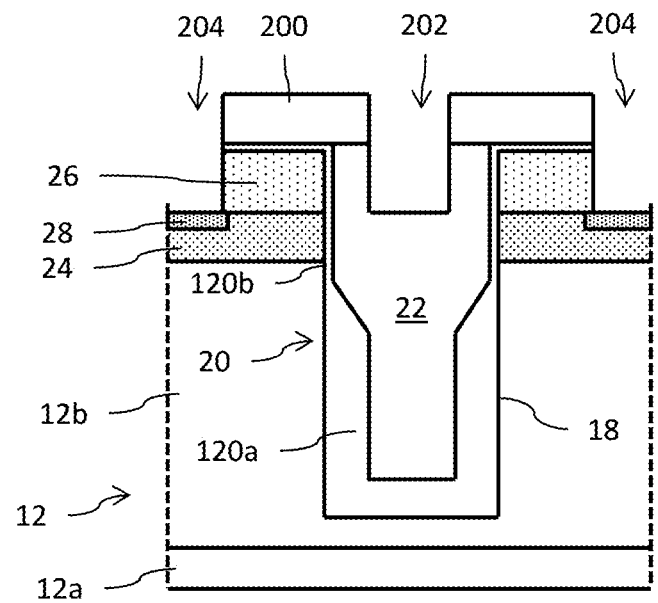

It will be noted that process described above in connection with FIGS. 20A, 21A and 22A, will typically require the use of two distinct masking and etching operations to form the openings 202 and 204. In an alternative implementation, only one masking and etching operation is used in connection with the formation of openings 202 and 204. FIG. 20B shows the formation of openings 202 and 204 extending from an upper surface of the PMD layer 200. The openings 202 and 204 are simultaneously formed using conventional lithographic processing techniques with a single masking and etching operation. The openings 202 extend completely through both the PMD layer 200 and the doped source region 26 to reach into the at least the top of the doped body region 24. The openings 204 extend completely through the PMD layer 200 and into the polysilicon material 122. The openings 202 and 204 may, for example, have similar depths dependent on etch rate relative to the doped source region 26 and the doped polysilicon material 122. In connection with the formation of the openings 202 and 204, a dopant implantation process is performed to implant body contact regions 28 in the body region 24 at the bottom of each opening 204. It will be noted that the high dopant concentration level in the polysilicon material 122 will prevent the formation of a p-n junction at the opening 202.

The openings 202 and 204 are then filled with a metal material (for example, tungsten) to form electrical contacts 206. The result is shown in FIG. 21B.

Figure 22B:
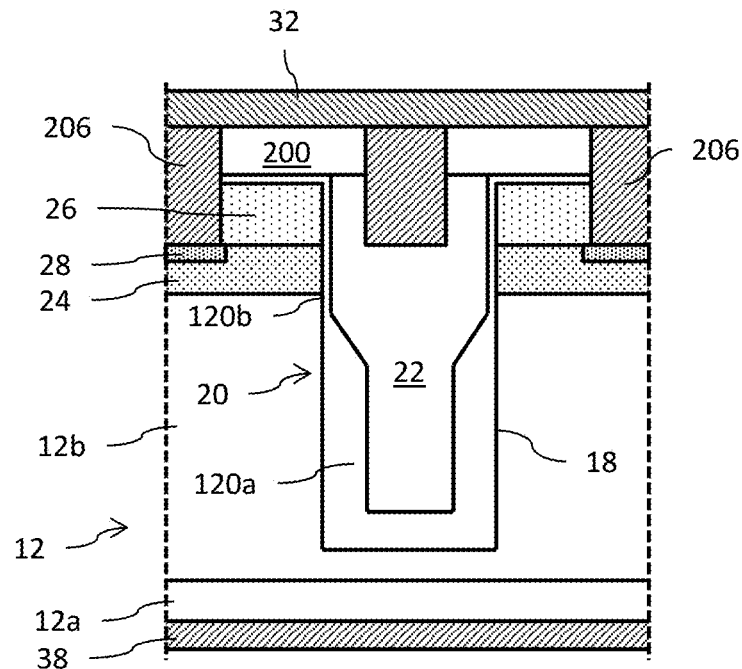
Figure 23:
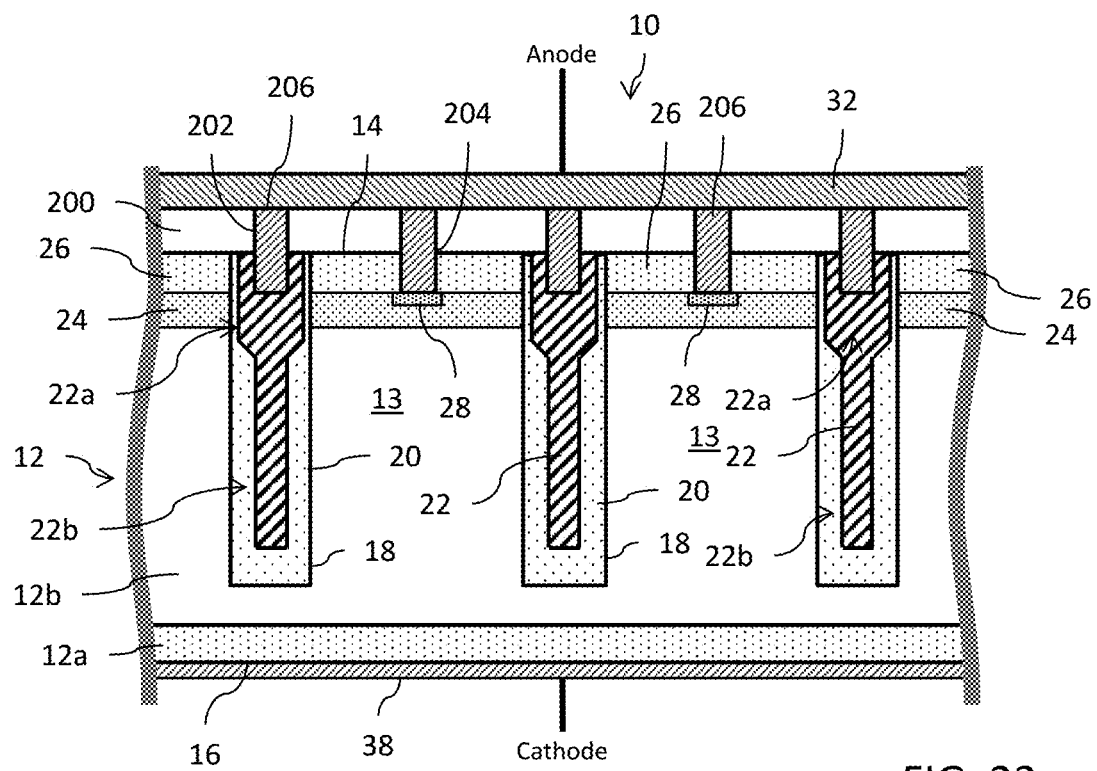
FIG. 23 shows a cross-section of an alternative embodiment for a charge coupled FERD device made in accordance with the process of FIGS. 20B-22B.

An anode metal layer 32 is then blanket deposited over the PMD layer 200, and lithographically patterned as needed, to provide electrical connection to the anode terminal of the field effect diode. The back side 16 of the substrate 12 is further processed with a backlap and/or grind to provide a surface to which a cathode metal layer 38 is deposited. The result is shown in FIG. 22B and the process for forming the diode 10 as shown in FIG. 23 is complete.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A method, comprising:
   forming a trench in a semiconductor substrate which provides a cathode region of a field effect rectifier diode (FERD);
   lining the trench with a first insulation layer;
   depositing a hard mask layer on the first insulation layer;
   performing an etch controlled by the hard mask layer to selectively remove a first portion of the first insulating layer from an upper portion of the trench while leaving a second portion of first insulating layer in a lower portion of the trench;
   removing the hard mask layer from the trench;
   lining an upper portion of the trench with a second insulation layer that extends from the second portion of first insulating layer;
   wherein an opening in the trench includes a lower open portion delimited by the second portion of first insulating layer in the lower portion of the trench and an upper open portion delimited by the second insulation layer at the upper portion of the trench;
   making a single deposition of polysilicon material in the trench to fill said opening in the trench;
   wherein said polysilicon material filling the opening forms a unitary conductive structure in the trench comprising: a field plate of the FERD insulated from the semiconductor substrate by the second portion of first insulating layer and a gate of the FERD insulated from the semiconductor substrate by the second insulating layer;
   implanting and activating a first type dopant in the semiconductor substrate to form a body region of the FERD; and
   implanting and activating a second type dopant in the semiconductor substrate to form a source region of the FERD.

2. The method of claim 1, further comprising:
   forming a cathode metal layer over a back side of the semiconductor substrate, said cathode metal layer in electrical connection with the cathode region; and
   forming an anode metal layer over a front side of the semiconductor substrate, said anode metal layer in electrical connection with both the polysilicon material and the source region.

3. The method of claim 2, further comprising electrically connecting the anode metal layer to the body region.

4. The method of claim 3, wherein electrically connecting comprises implanting and activating the first type dopant to form a body contact region at the body region.

5. The method of claim 1, wherein depositing the hard mask layer comprises conformally depositing a layer of nitride in the trench on a surface of the first insulation layer.

6. The method of claim 1, further comprising, after depositing the hard mask layer and before performing the etch, filling an open portion of the trench with a resist material, said open portion being left in the trench after depositing of the hard mask layer.

7. The method of claim 6, wherein removing the hard mask layer from the trench further comprises removing the resist material from the trench.

8. The method of claim 1, further comprising, after depositing the hard mask layer on the first insulation layer, removing a portion of the hard mask layer to expose an upper end of the first insulation layer, and wherein performing the etch comprises recessing, from the exposed upper end, the first insulation layer in the upper portion of the trench.

9. A FERD device made using the method as recited in claim 1.

10. A method, comprising:
forming a trench in a semiconductor substrate;
lining the trench with a first insulation layer;
depositing a hard mask layer on a surface of the first insulation layer in the trench;
performing an etch controlled by the hard mask layer to selectively remove a first portion of the first insulating layer from an upper portion of the trench while leaving a second portion of first insulating layer in a lower portion of the trench;
removing the hard mask layer from the trench;
lining the upper portion of the trench with a second insulation layer extending from the second portion of first insulating layer; and
making a single deposition of polysilicon material in the trench to fill an opening in the trench, said opening having a lower open portion delimited by the second portion of first insulating layer in the lower portion of the trench and an upper open portion delimited by the second insulation layer at the upper portion of the trench.

11. The method of claim 10, wherein depositing the hard mask layer comprises conformally depositing a layer of nitride in the trench on the surface of the first insulation layer.

12. The method of claim 10, further comprising, after depositing the hard mask layer and before performing the etch, filling an open portion of the trench which is left after depositing of the hard mask layer with a resist material.

13. The method of claim 12, wherein removing the hard mask layer from the trench further comprises removing the resist material from the trench.

14. The method of claim 10, further comprising, after depositing the hard mask layer on the first insulation layer, removing a portion of the hard mask layer to expose an upper end of the first insulation layer, and wherein performing the etch comprises recessing, from the exposed upper end, the first insulation layer in the upper portion of the trench.

15. An integrated circuit device made using the method as recited in claim 10.

16. A method, comprising:
forming a trench in a semiconductor substrate which provides a cathode region of a field effect rectifier diode (FERD);
lining the trench with a first insulation layer;
selectively removing a first portion of the first insulating layer from an upper portion of the trench while leaving a second portion of first insulating layer in a lower portion of the trench;
lining the upper portion of the trench with a second insulation layer that extends from the second portion of first insulating layer;
making a single deposition of polysilicon material in the trench to fill an opening in the trench;
wherein said opening has a lower open portion delimited by the second portion of first insulating layer in the lower portion of the trench and an upper open portion delimited by the second insulation layer at the upper portion of the trench.

17. The method of claim 16, wherein said polysilicon material filling the opening forms a unitary conductive structure in the trench comprising: a first conductive portion providing a field plate of the FERD insulated from the semiconductor substrate by the second portion of first insulating layer and a second conductive portion providing a gate of the FERD insulated from the semiconductor substrate by the second insulating layer.

18. The method of claim 17 further comprising:
implanting and activating a first type dopant in the semiconductor substrate to form a body region of the FERD; and
implanting and activating a second type dopant in the semiconductor substrate to form a source region of the FERD.

19. The method of claim 18, further comprising:
forming a cathode metal layer over a back side of the semiconductor substrate, said cathode metal layer in electrical connection with the cathode region; and
forming an anode metal layer over a front side of the semiconductor substrate, said anode metal layer in electrical connection with both the polysilicon material and the source region.

20. The method of claim 19, further comprising electrically connecting the anode metal layer to the body region.

21. The method of claim 20, wherein electrically connecting comprises implanting and activating the first type dopant to form a body contact region at the body region.

22. The method of claim 16, further comprising depositing a hard mask layer made of a conformal nitride later in the trench on a surface of the first insulation layer.

23. A method, comprising:
forming a trench in a semiconductor substrate;
lining the trench with a first insulation layer;
depositing a hard mask layer made of a conformal nitride later in the trench on a surface of the first insulation layer;
after depositing the hard mask layer, filling an open portion of the trench with a resist material;
selectively removing a first portion of the first insulating layer from an upper portion of the trench while leaving a second portion of first insulating layer in a lower portion of the trench;
lining the upper portion of the trench with a second insulation layer that extends from the second portion of first insulating layer;
making a single deposition of polysilicon material in the trench to fill an opening in the trench;

wherein said opening has a lower open portion delimited by the second portion of first insulating layer in the lower portion of the trench and an upper open portion delimited by the second insulation layer at the upper portion of the trench.

24. The method of claim 23, further comprising removing a portion of the hard mask layer to expose an upper end of the first insulation layer, and wherein selectively removing comprises performing the etch to recess, from the exposed upper end, the first insulation layer in the upper portion of the trench.

25. The method of claim 23, wherein the semiconductor substrate provides a cathode region of a field effect rectifier diode (FERD).

26. The method of claim 22, further comprising removing a portion of the hard mask layer to expose an upper end of the first insulation layer, and wherein selectively removing comprises performing the etch to recess, from the exposed upper end, the first insulation layer in the upper portion of the trench.

* * * * *